United States Patent [19]

Voisine et al.

[11] Patent Number: 4,887,028

[45] Date of Patent: Dec. 12, 1989

[54] WATTHOUR METER WITH ISOLATION TRANSFORMERS HAVING A FEEDBACK LOOP

[75] Inventors: John T. Voisine, Lafayette, Ind.; Andy Joder, Unteraegeri, Switzerland

[73] Assignee: Landis & Gyr Metering, Inc., Lafayette, Ind.

[21] Appl. No.: 99,257

[22] Filed: Sep. 21, 1987

[51] Int. Cl.$^4$ .................... G01R 21/00; G01R 15/02; H01F 27/42

[52] U.S. Cl. .................................. 324/142; 324/127; 323/356

[58] Field of Search ............... 324/142, 141, 127, 107; 323/357, 358, 356; 340/657, 637; 364/483; 307/511, 515; 328/5

[56] References Cited

U.S. PATENT DOCUMENTS

| | | | |
|---|---|---|---|
| 2,919,408 | 12/1959 | Brown ................................ | 324/142 |
| 3,458,650 | 7/1969 | Miyawaki et al. | |
| 3,569,884 | 3/1971 | Wright et al. .................... | 336/96 X |
| 3,697,871 | 10/1972 | MacMullan ...................... | 324/99 R |
| 3,775,683 | 11/1973 | Barta et al. ...................... | 324/142 X |
| 3,881,149 | 4/1975 | Kiko ................................ | 324/127 X |
| 3,916,310 | 10/1975 | Stark et al. ...................... | 324/127 X |
| 4,054,829 | 10/1977 | Searle ............................. | 323/356 X |
| 4,056,775 | 11/1977 | Milkovic ......................... | 324/142 X |
| 4,417,198 | 11/1988 | Mayfield ......................... | 363/126 X |
| 4,454,471 | 6/1984 | Schwendtner et al. .......... | 324/142 X |
| 4,498,138 | 2/1985 | Moore ............................. | 364/483 X |
| 4,514,685 | 4/1985 | Gilker ............................. | 324/142 X |
| 4,514,686 | 4/1985 | Mayfield ......................... | 324/142 X |
| 4,542,469 | 9/1985 | Brandyberry et al. .......... | 364/483 X |
| 4,553,091 | 11/1985 | Bristol ............................ | 324/130 X |
| 4,626,778 | 12/1986 | Friedl ............................. | 324/127 X |
| 4,634,911 | 1/1987 | Studniarz et al. ............... | 310/215 X |

FOREIGN PATENT DOCUMENTS

| | | | |
|---|---|---|---|
| 2812303 | 10/1979 | Fed. Rep. of Germany ...... | 323/356 |
| 0055024 | 5/1981 | Japan .................................. | 323/357 |

Primary Examiner—Ernest F. Karlsen
Assistant Examiner—Vinh P. Nguyen
Attorney, Agent, or Firm—Woodard, Emhardt, Naughton Moriarty & McNett

[57] ABSTRACT

A voltage transducer in a watthour meter, for sensing AC line voltage across a load, includes a current transformer having its primary winding connected in series with a current-limiting resistor across the AC source. The transformer includes a secondary coil and a tertiary coil. The current through the secondary coil represents the sensed voltage and is signal conditioned through an integrator circuit for input to a solid-state watt transducer chip. An active circuit is connected across the tertiary coil, with an output feeding a compensating current into the input of the secondary coil. The active circuit includes an RC network at the output of the tertiary coil for providing a loop stability. A first non-inverting op amp amplifies the voltage output from the RC network to provide a phase correction, adjustable by a replaceable resistor connected between the inverting node of the first op amp and an electrical ground. An intergrating op amp is connected between the output of the first op amp and the input to the tertiary coil to form a feedback circuit to reduce DC offset signals from the output of the first op amp. The primary coil of the current transformer is composed of an electric conductor wire coated with an electrically insulating layer to withstand impulse voltages of at least 6 kV.

12 Claims, 2 Drawing Sheets

WATTHOUR METER WITH ISOLATION TRANSFORMERS HAVING A FEEDBACK LOOP

BACKGROUND OF THE INVENTION

The present invention relates to watthour meters using isolation transformers for sensing the line voltage across a load.

A typical watthour meter includes means for sensing the load current and line voltage drawn by a load from an AC power source. The current and voltage signals thus derived are multiplied to produce a signal corresponding to the amount of AC electrical energy consumed by the load. This multiplication function is frequently performed by a solid state circuit to replace the mechanical metering methods previously used.

In electronic watthour meters of the type described, the line voltage is typically sensed using a voltage transformer connected across the AC source. The primary and secondary coils of these voltage transformers are generally heavily insulated to account for high voltage transients across the primary coil induced, for instance, by a lightning strike between the AC source and the watthour meter. Particularly in electronic watthour meters, electric isolation between the primary and secondary coils is important to protect the solid state components of the meter as well as to protect the customer or meter-reader from electrical shock. Because of the amount of isolation required to achieve proper isolation, voltage transformers are typically large and expensive.

As watthour meters become more sophisticated, employing more solid-state circuitry, there is an emphasis on reducing the size and expense of the meter components, including the voltage sensing means. Thus, it is an object of the present invention to provide a replacement for the typical voltage transformer that is smaller and less expensive. Another object is to provide voltage sensing means in a watthour meter that maintains the acceptable electrical isolation characteristic required for watthour meters.

SUMMARY OF THE INVENTION

According to one aspect of the present invention, a voltage transducer in an electronic watthour meter, for producing a signal corresponding to the AC line voltage, includes a current transformer having its primary coil connected in series with a resistor across the AC source. The current transformer has secondary and tertiary coils, with the voltage sensing signal determined by the current output from the secondary coil. An active circuit is connected at its inputs across the tertiary coil and at its output to the input of the secondary coil for producing a compensating current from the voltage across the tertiary coil, the compensating current being sufficient to compensate the phase error of the secondary coil. In another aspect of the invention, the primary coil of the current transformer is composed of an electric conductor wire coated with an electrically insulating layer.

DESCRIPTION OF THE PREFERRED EMBODIMENT

Figure 1:
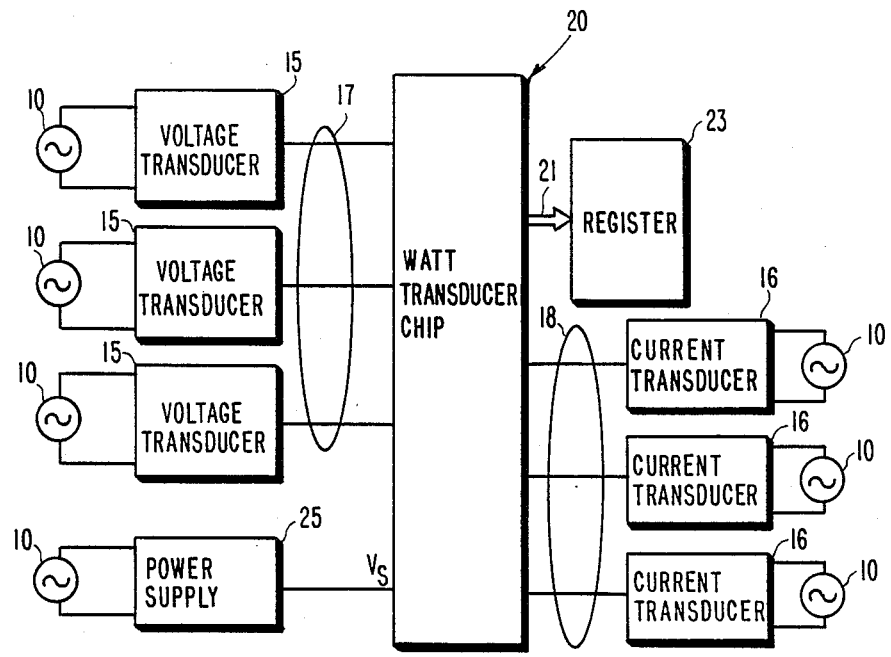
FIG. 1 is a block diagram of the watthour meter of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

The watthour meter of the preferred embodiment is connected to a three-phase AC source in a Wye configuration and measures the AC electrical power consumption of a similarly configured load. However, the invention may be practiced in other single or poly-phase systems connected in a Delta or Wye configuration. The watthour meter of the preferred embodiment includes voltage transducers 15 and current transducers 16 electrically connected across each phase of the AC source 10. Voltage transducers 15 generate voltage signals 17 that are reduced to levels compatible with the solid-state circuitry of the watthour meter. Likewise, current transducers 16 produce current signals 18 reduced to compatible current levels. The voltage signals 17 and current signals 18 are fed into a solid-state watt transducer chip 20. The watt transducer chip 20 produces output signals 21 corresponding to the AC electrical power consumption by the load. The output signals 21 are the product of the incoming voltage signals 17 and current signals 18, calculated in the watt transducer chip 20 using standard solid state measurement methods, such as Time Division Multiplication used in the preferred embodiment. The output signals 21 from watt transducer chip 20 are fed into register 23 which records and displays the power consumption information. Register 23 may also contain custom integrated circuits for performing additional calculations for time of use and load profile, for instance. Since watt transducer chip 20 and register 23 each utilize solid-state integrated circuits, a separate power supply is required. Thus, power supply 25 is provided to convert power from AC source 10 into a regulated DC voltage for watt transducer chip 20.

Figure 2:
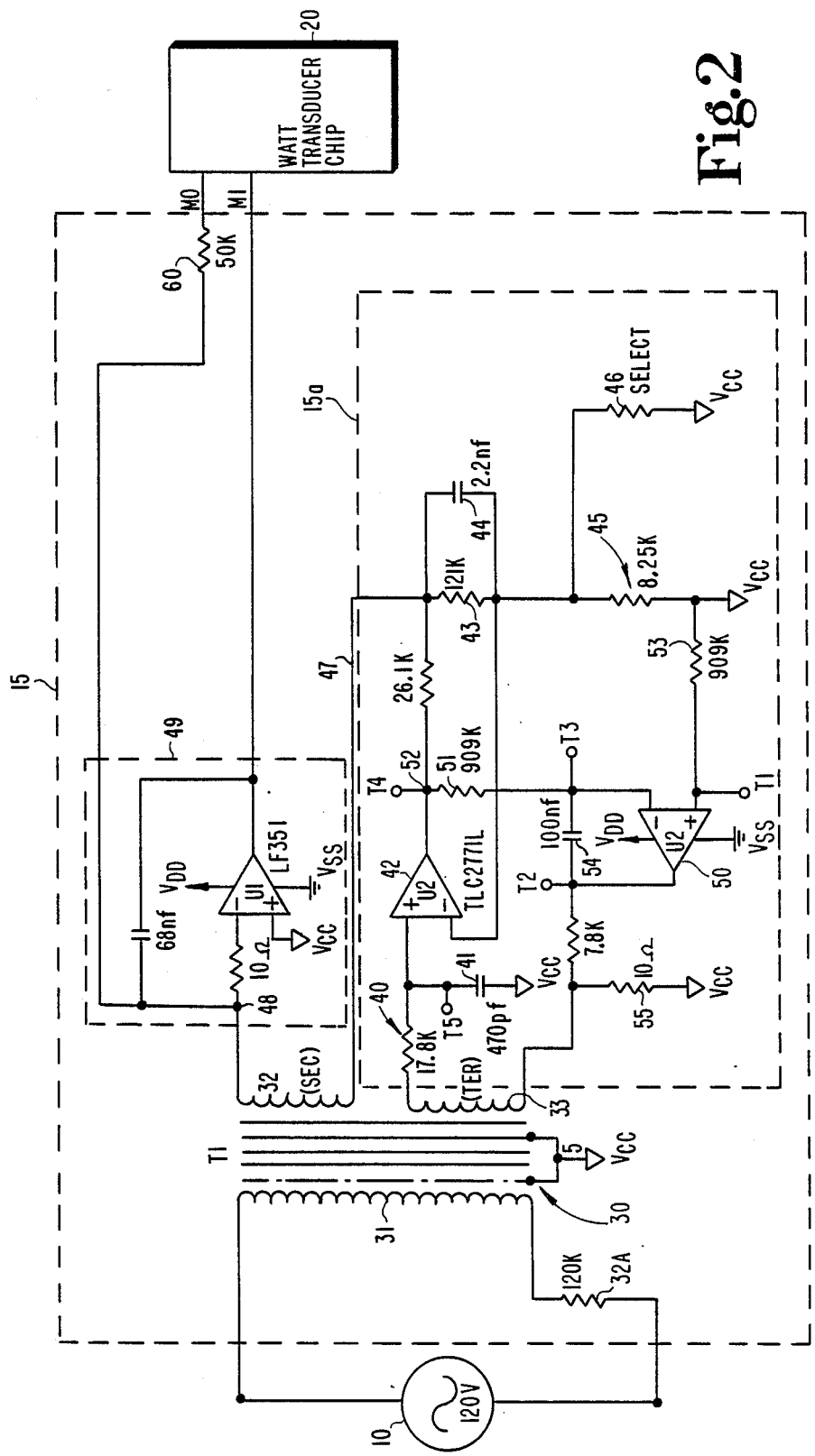
FIG. 2 is a schematic diagram of the voltage transducer for the watthour meter of the present invention.

The details of voltage transducer 15 are described with reference to FIG. 2. It will be noted that the voltage transducers 15 for each phase are identical in construction, so only one phase will be described. The voltage transducer 15 includes a current transformer 30 connected in across the AC source 10. A resistor 32A is coupled in series with the primary coil 31 of the current transformer 30. As described above, voltage sensing by the voltage transformer of the prior art necessitates a great degree of isolation between the primary and secondary coils to account for voltage transients at the primary coil. However, with the use of the resistively coupled current transformer 30, less isolation is required because the effect of voltage transients on the primary coil 31 is greatly diminished. Resistor 32A connected in series with the primary coil 31 is sized to cause a very small current to flow through primary coil 31. In the preferred embodiment, resistor 32A has a value of 120k- ohms, which produces a current in primary coil 31 of about 1 milliampere from the 120 volt AC source 10. Resistor 32A is preferably a low inductance, high voltage impulse tolerant, flat packaged product such as is marketed by Caddock Electronics, Inc., Riverside, Calif.

By, in essence, converting the voltage signal to be sensed into a current through the current transformer 30, optimum electrical isolation is achieved at a savings of transformer size and expense. Since the current through the primary coil 31 of current transformer 30 is very low, a smaller transformer may be utilized having fewer turns in the primary and secondary coils. The smaller current transformer 30 is beneficial in that it is less expensive and requires less physical space within the watthour meter than the conventional voltage transformers. However, the smaller current transformer 30 leads to larger phase errors between the current sensed at the secondary coils and the current supplied by AC source 10. Moreover, the natural inductance of the primary coil 31 coupled in series with resistor 32A forms an RL circuit, which itself produces some phase shift of the incoming AC signal.

The phase error induced in the current transformer 30 of the present invention must be compensated before the signal from voltage transducer 15 is fed into the watt transducer chip 20. An uncompensated signal 17 will lead to errors in the power consumption calculations performed in watt transducer chip 20. In the preferred embodiment, current transformer 30 includes a secondary coil 32 and a tertiary coil 33 in which a reduced alternating current is induced by the primary coil 31. Secondary coil 32 provides the input signal MI to the watt transducer chip 20 through an integrator circuit 49. Integrator circuit 49 converts the current from secondary coil 32 to a duty cycle modulated square wave in response to an output signal MO from watt transducer chip 20. A resistor 60 is connected between chip 20 at the output signal MO and the integrator circuit 49. Resistor 60 and resistor 32A, which is connected in series with the current transformer 30, are mounted on the same thermally conductive substrate. Thus, any temperature changes experienced by resistor 32A that would vary the impedance of resistor 32A, and consequently the current level through transformer 30, are compensated by equivalent variations in resistor 60 due to the same temperature changes.

Tertiary coil 33 provides a voltage to the active phase adjusting circuitry 15a used to compensate for the phase error induced by current transformer 30. Secondary coil 32 and tertiary coil 33 have the same number of turns and are inductively coupled so that the same induced voltage will be sensed by each.

A resistor 40 couples the output of the tertiary coil 33 and a capacitor 41, the capacitor 41 being connected from resistor 40 to the line neutral potential $V_{cc}$. Resistor 40 and capacitor 41 form a low pass RC filter that provides loop stability. In the preferred embodiment, resistor 40 has a value of 17.8 K-ohms and capacitor 41 has a value of 470 pico-farads.

Compensation for the phase error is accomplished by way of operational amplifier 42. The output of the RC network of resistor 40 and capacitor 41 is fed into the non-inverting, or positive, node of op amp 42. A feedback loop is provided not only from the output of op amp 42 to the inverting, or negative, node, but also through the coupling of the secondary coil 32 to the tertiary coil 33. The feedback loop includes, in one path, resistor 43 and capacitor 44 connected in parallel. Resistor 45 and replaceable resistor 46, connected in parallel, are shunted between the inverting node of op amp 42 and the electrical ground at circuit ground potential $V_{cc}$. The gain of the op amp 42 circuit is a function of the ratio of the impedance in the feedback loop, determined by resistor 43, the impedance at the inverting node, determined by resistors 45 and 46, and the capacitance of the loop stabilizing capacitor 44. By varying the value of resistor 46, this ratio can be modified which, in turn, modifies the gain of the op amp 42 circuit. The proper selection of resistor 46 can produce a phase error correction to compensate for (reduce) any phase error of the secondary coil 32 of current transformer 30.

The amplified voltage from the op amp 42 is fed to the input of secondary coil 32 along line 47 from the output of op amp 42. The current from op amp 42 supplies the current in the secondary coil 32, thus minimizing phase error.

As is typical with op amps, the AC output voltage from op amp 42 has some DC offset. The output voltage from op amp 42 is seen by the integrated circuits of watt transducer chip 20. In the preferred embodiment, the customs I.C.s of chip 20 have a very low tolerance to a superimposed DC signal. Thus, it is essential that this DC offset be corrected to avoid errors in the measurement of power. This DC offset correction is accomplished by a feedback loop through op amp 50. A resistor 51 is connected between junction 52 downstream from the output of op amp 42, and the inverting node of op amp 50. Resistor 53 is connected from the non-inverting node of op amp 50 to the circuit ground potential $V_{cc}$. Resistors 51 and 53 have equal resistance values, in the preferred embodiment, so that the input impedances to op amp 50 are balanced as a means to minimize the output voltage error of op amp 50. Capacitor 54 in the feedback from the output of op amp 50 to the inverting node creates an integrating op amp thus, op amp 50 and capacitor 54 integrate and invert the output from op amp 42 to produce a DC voltage across resistor 55 that tends to offset the DC components of the signal from op amp 42. The DC voltage across resistor 55, which is shunted to the line neutral potential $V_{cc}$, is also seen at the non-inverting node of op amp 42. The imposition of this negative offsetting DC voltage from op amp 50 reduces the output voltage error from op amp 42. These DC signals cycle within the feedback loop, including op amp 42 and op amp 50, until the DC offset at the output of op amp 42 is reduced to a level compatible with the integrated circuits of the watt transducer chip 20.

Figure 3:
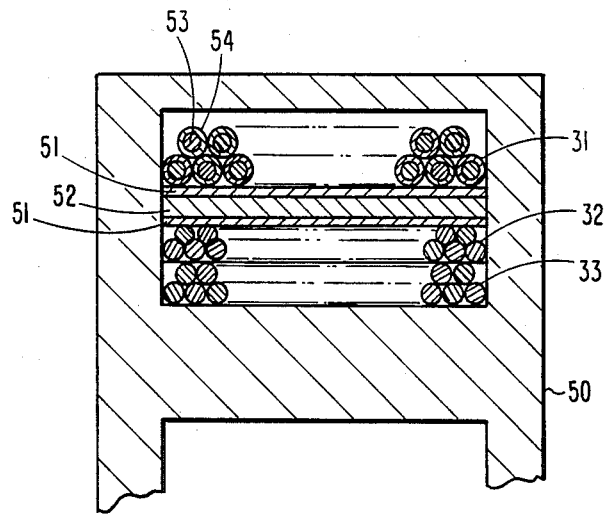
FIG. 3 is a partial cross-sectional view of the current transformer in the voltage transducer of the present invention.

In another aspect of the present invention, the electrical isolation of the current transformer 30 is accomplished in a different manner than the isolation transformers used in prior art watthour meters. In the prior art meters, isolation is achieved by potting or insulation surrounding the primary and/or secondary coils. However, use of a suitable resistor 32A in series with the primary coil 31 of the current transformer allows for fewer turns of conductive wire in the primary coils 31. Since fewer turns are required in the coil, the insulation potting of the prior art may be dispensed with in favor of insulating the conductive wire in the primary coil 31, as illustrated in FIG. 3. Referring to the cross-section of the current transformer in FIG. 3, the tertiary coil 33 is wound around a ferrite core 50, and the secondary coil 32 is wound around the tertiary coil. The secondary and tertiary coils are surrounded by insulation 51 and a electrostatic shield 52 included to reduce electrostatic coupling between the primary coil 31 and the secondary coil 32. The primary coil 31 is wound around the electrostatic shield 52 and is shown as comprising a conductive wire 53 coated with an insulation layer 54, so that each turn of the primary coil 31 is individually insulated. Since the primary coil has few turns, the size of the coil is not greatly affected by the increased diameter of the conductive wires due to the addition of the insulation layer. No additional insulation or potting is necessary, so the current transformer 30 of the present invention can be much smaller than the isolation transformers of the prior art.

The insulation layer 54 is composed of a material having a dielectric constant sufficient to withstand a high voltage surge without breakdown. According to typical design standards, watthour meters must be capable of enduring a 6 kV surge without breakdown of the electrical isolation across the transformer. In the preferred embodiment, the insulation layer 54 is an extruded wire wrap known by the tradename Tefzel, which is a fluorocarbon polymer coating. In the preferred embodiment, wire including a Tefzel insulation layer is used in the primary coil, such as a wire sold by the Alpha Wire Corporation of Elizabeth, N.J. as Alpha wire type 1805.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. An electronic watthour meter for measuring AC power consumption comprising:
    a current transducer for producing a current signal corresponding to the AC load current;
    voltage sensing means for producing a voltage signal corresponding to the AC line voltage, said voltage sensing means including a current transformer having a primary coil connected in series with a resistance and a secondary coil;
    measurement circuit means having inputs receiving the voltage signal and the current signal for multiplying said voltage signal and said current signal; and
    active phase adjusting circuit means for adjusting the phase of one of said signals input to said measurement circuit means to cause the product of the current signal and the voltage signal to represent the actual AC power consumption.

2. The electronic watthour meter of claim 1, wherein:
    said secondary coil of said transformer includes a first coil segment and a second coil segment;
    said voltage signal is a current through said first coil segment; and
    the input of said active circuit means is coupled to said second coil segment, and said active circuit means includes compensating means for applying a compensating current to the input of said first coil segment sufficient to reduce the phase error of the induced current in said first segment.

3. The electric watthour meter of claim 2, wherein:
    said compensating means includes a non-inverting op amp circuit connected at the non-inverting node of said op amp to the output of said second coil segment and having means for adjusting the phase of the induced current in said first coil segment by varying the gain of said op amp circuit, wherein said phase adjusting means includes a replaceable resistor connected from the inverting node of said op amp to an electrical ground.

4. The electronic watthour meter of claim 1, wherein said active circuit means further includes an op amp circuit and means for reducing DC offset voltages from said op amp circuit.

5. The electronic watthour meter of claim 4 in which said means for reducing DC offset voltages includes an active circuit having its input coupled to the output of the op amp in said op amp circuit and its output coupled to the input of the op amp.

6. The electronic watthour meter of claim 1, in which said current transformer is an isolation transformer.

7. The electronic watthour meter of claim 6, wherein the primary coil of said transformer is composed of an electric conductor wire coated with an electrically insulating layer having a dielectric strength sufficient to withstand an 6kV surge through said wire.

8. The electronic watthour meter of claim 1, further comprising:
    means for conditioning said voltage signal having a temperature compensating resistor wherein said resistance includes a current-limiting resistor which is mounted on a thermally conductive substrate and said temperature compensating resistor is mounted on said substrate for compensating the temperature effects on said current limiting resistor.

9. The electronic watthour meter of claim 1, wherein:
    said active phase adjusting circuit means has its output connected to a first end of a secondary coil of said current transformer for providing a compensating current to said secondary coil; and
    said watthour meter further comprises a means, independent of said active phase adjusting circuit means, for providing said voltage signal to said measurement circuit means from the current flowing from the second end of the secondary coil of said current transformer.

10. The electronic watthour meter of claim 9, further comprising a tertiary coil of said current transformer and in which said active phase adjusting circuit means has its input coupled to said tertiary coil.

11. The electronic watthour meter of claim 1, in which said active phase adjusting circuit means includes active circuit means having its output coupled to said secondary coil of said current transformer for compensating the phase error of said transformer.

12. The electronic watthour meter of claim 1 in which said resistance has a value of at least about 120K ohms.

* * * * *

UNITED STATES PATENT AND TRADEMARK OFFICE
CERTIFICATE OF CORRECTION

PATENT NO. : 4,887,028

DATED : December 12, 1989

INVENTOR(S) : John T. Voisine and Andy Joder

It is certified that error appears in the above-identified patent and that said Letters Patent is hereby corrected as shown below:

In column 6, line 2, please change "first segement" to --first coil segment--.

In column 6, line 3, please change "electric" to --electronic--.

In column 6, line 32, please change "resistor wherein said" to --resistor;
Wherein said--.

Signed and Sealed this

Thirtieth Day of October, 1990

Attest:

HARRY F. MANBECK, JR.

*Attesting Officer*    *Commissioner of Patents and Trademarks*